United States Patent [19]
Meisser et al.

[11] Patent Number: 5,569,402
[45] Date of Patent: Oct. 29, 1996

[54] CURING OVEN FOR MAGAZINE HOLDING COMPUTER CHIP LEAD FRAMES, PROVIDING FLOW DIRECTION CONTROL FOR HOT GAS STREAM

[75] Inventors: Claudio Meisser, Cham; Rolf Honegger, Horgen, both of Switzerland

[73] Assignee: ESEC S.A., Cham, Switzerland

[21] Appl. No.: 190,027

[22] PCT Filed: May 21, 1993

[86] PCT No.: PCT/CH93/00131

§ 371 Date: Jun. 7, 1994

§ 102(e) Date: Jun. 7, 1994

[87] PCT Pub. No.: WO93/24801

PCT Pub. Date: Dec. 9, 1993

[30] Foreign Application Priority Data

Jun. 3, 1992 [CH] Switzerland .......................... 01786/92

[51] Int. Cl.⁶ .............................. F27B 17/00; F26B 21/02
[52] U.S. Cl. .......................................... 219/400; 126/21 A
[58] Field of Search .................................... 219/400, 401; 126/21 A

[56] References Cited

U.S. PATENT DOCUMENTS

| | | |
|---|---|---|
| 3,429,057 | 2/1969 | Thygesson . |
| 4,623,780 | 11/1986 | Shelton ................................. 219/400 |
| 4,627,409 | 12/1986 | Kagomoto ........................... 126/21 A |
| 4,750,276 | 6/1988 | Smith et al. ........................... 219/400 |
| 4,914,834 | 4/1990 | Sime . |
| 5,272,963 | 12/1993 | Del Fabbro ............................ 219/400 |

FOREIGN PATENT DOCUMENTS

| | | |
|---|---|---|
| 2079146 | 11/1971 | France . |
| 2090962 | 7/1982 | United Kingdom . |
| WOA8404808 | 12/1984 | WIPO . |
| WOA9102106 | 2/1991 | WIPO . |

*Primary Examiner*—Philip H. Leung
*Attorney, Agent, or Firm*—Cushman Darby & Cushman, L.L.P.

[57] ABSTRACT

In the case of a curing installation, in particular for magazines with lead frames which are fitted with electronic chips, there is provided at least one box ($R_2$) which can be closed by a door and in which at least one fan is arranged for subjecting the lead frames in the magazine to hot gas. The fan is supported on a housing of the box ($R_2$) and is arranged in such a way that it produces in the region of the magazine at least one essentially horizontally directed gas stream essentially parallel to the longitudinal direction of the magazine, so that gas flows through the magazine. The fan may be designed as a helical fan or a radial fan, and the direction of the gas stream may be varied by reversal of the direction of rotation of the fan.

17 Claims, 6 Drawing Sheets

CURING OVEN FOR MAGAZINE HOLDING COMPUTER CHIP LEAD FRAMES, PROVIDING FLOW DIRECTION CONTROL FOR HOT GAS STREAM

BACKGROUND OF THE INVENTION

1. Field of the Invention

The invention relates to an apparatus for the heat treatment of at least one essentially cuboidal magazine for lead frames, which are parallel to a horizontal longitudinal direction of the magazine and are fitted with electronic chips, in at least one box which has a housing with a charging opening which is defined by end edges and can be closed by a door, and in which box at least one fan is arranged for subjecting the lead frames in the magazine to a hot gas.

2. Discussion of the Prior Art

Competitiveness in the mass production of semiconductors is nowadays in particular a question of the yield of qualitatively satisfactory components. The corresponding production batches must be made ready without a significant increase in costs and without an extended delivery time. This challenge calls for the use of processes and installations of very high reliability and productivity, it also being required that the smallest batch sizes can be processed without profitability being adversely affected by the batch size. For this purpose, various line concepts have been developed in order to feed lead frames arranged in magazines and fitted with electronic chips to individual wiring stations (so-called wire bonders). The lead frames are in this case passed from work station to work station.

One of these work stations comprises a curing installation, in which a so-called curing takes place, i.e. a hardening by polymerization of the epoxy resins, and here, in particular, of the adhesives which are used for fastening the electronic chips onto the lead frames.

For this purpose, until now a plurality of magazines with lead frames have been brought into a corresponding oven and subjected to hot gas (air or inert gas). This random heat treatment has considerable disadvantages, however, with respect to the curing process, the temperature profile, the stressing of the electronic components and the accompanying contamination of the components, of the lead frames and of the environment.

The object of the present invention is to provide a curing installation in which the abovementioned disadvantages do not occur, by the corresponding lead frames being treated in a specific and controlled manner such that uniform curing over the entire length of the lead frame takes place, and the electronic chips present on it are subjected to as little stressing as possible, keeping their contamination and the polluting of the environment to a minimum.

This object is achieved by the fan being supported on the housing and arranged therein in such a way that it generates in the region of the magazine at least one essentially horizontally directed gas stream which is essentially parallel to the longitudinal direction of the magazine, in order that the gas flows through the magazine.

As a result, the heat transfer between the gas and the electronic chips on the lead frames in the magazine is subsfantially increased, and consequently, the period of time which is required for heating up or cooling the electronic chips on the lead frames in the magazine is subsfantially reduced. Thus, the very temperature-sensitive electronic component parts of the electronic chips are subjected as little as possible and at the same time uniformly, to high temperatures. It is optimal to subject the chips to high temperatures only for as long as is necessary, in order, for example, to cure resins contained therein or, in general, to allow the desired chemical reactions to proceed therein.

Although the expectations with respect to the temperature consfancy in the magazine are already met in this exemplary embodiment, the time up until the electronic components on the gas outlet side of the magazine have virtually the same temperature as on the gas inlet side can be shortened still further.

SUMMARY OF THE INVENTION

Preferably, at least part of the heater is located on an essentially horizontal section of a gas stream leading from the magazine to the fan or from the fan to the magazine. In one design of the apparatus according to the invention, in this case the heater is of two parts, with one part of the heater in each case located on the respective sections of the gas streams leading from the magazine to the fan and from the fan to the magazine. By this arrangement of the heating, the risk of thermal stratifications is avoided, since the heated gas is swirled in the fan, and, consequently, is mixed very well.

Between the fan and the magazine there is preferably arranged at least one gas-conducting element, this gas-conducting element preferably being designed as a baffle, wall, gas-conducting branch or the like. These gas-conducting elements bring about a specific conducfance of the gas stream to the lead frames in the magazine. The gas stream is sucked in by the heater and/or expelled by means of a corresponding fan, and then fed to the magazine with the lead frames, in order to flow through this magazine so that the lead frames are heat-treated.

In one design of the apparatus according to the invention, the fan is designed as a helical fan, i.e. as a fan with helical blades, with its shaft and its gas expulsion respectively extending and occurring in a direction which is essentially parallel to the longitudinal direction of the magazine, and the gas-conducting element is designed as a baffle which is seated between the magazine and the fan and together with the side walls of the housing of the box forms forced-flow ducts. In this case, the direction of the gas stream preferably is made variable by reversing the direction of rotation of the helical fan, for example by alternately reversing the direction of rotation of the blades. This reversal of the direction of rotation may be performed, for example, with a periodicity of 10 to 30 seconds, preferably of 10 seconds. Thus, the magazine can be subjected to hot gas from both sides, in order further to reduce non-uniformities of the heat transfer which would be caused, for example, by the low heat capacity of the gas flowing only slowly through the magazine, by which the heating capacity is to be brought into the interior of the magazine.

In another design of the apparatus according to the invention, at least one duct is formed by chamber walls acting as gas-conducting elements adjoining the fan, which duct conducts a gas stream on one side to the lead frames arranged in the magazine. In this case, the fan may be designed as a radial fan, i.e. as a fan with radial blades, while the direction of the gas stream is variable by opening or closing corresponding forced-flow ducts preferably by means of mechanically actuable shut-off plates or gates. By analogy with the preceding text and with equivalent reasons and advantages, this actuation of the shut-off plates or gates may be performed, for example, with a periodicity of 10 to 30 seconds, preferably of 10 seconds.

In yet another design of the apparatus according to the invention, two forced-flow ducts or guide ducts are formed by at least one baffle acting as a gas-conducting element, or by at least one wall acting as a gas-conducting element, by which ducts a gas stream is in each case guided from the magazine to a fan or from a fan to the magazine. In these two designs, the gas may be sucked in through the one duct from the magazine, heated and, if appropriate, fed through the other, for example opposite, duct to the magazine again, or vice versa.

In a further design of the apparatus according to the invention, in the box there are arranged two fans, which are designed as radial fans and subject the magazine to gas in respectively opposed directions. Consequently, in this design, the gas can be sucked in an upper or lower region of the box in respectively opposed directions through the one duct from the magazine, heated, and fed through the other, for example opposite, duct to the magazine again. Preferably, in this case, each fan is assigned a gas-conducting branch, preferably provided with an annular flange, this gas-conducting branch being seated in a wall which adjoins a rear wall of the box and forms a guide duct towards the magazine. In this case, the heater may be designed as a heating spiral and be arranged between the gas-conducting branches of the two fans, a helix axis of the heating spiral being arranged essentially vertically and respective longitudinal axes of the gas-conducting branches being arranged essentially horizontally. In this case, a distribution of the gas stream in the box may be varied periodically by simulfaneous reversal of the direction of rotation of the two fans, for example by the direction of rotation of the blades being alternately reversed. By analogy with the preceding text and with equivalent reasons and advantages, this joint reversal of the direction of rotation of the two fans may be performed, for example, with a periodicity of 10 to 30 seconds, preferably of 10 seconds.

These preferred measures or their various combinations according to the invention have the effect of achieving, inter alia, an improved and therefore accelerated heating of the gas in the box and/or of the lead frames in tile magazine. In particular, the use of two fans and the joint periodic reversal of their direction of rotation leads to a compensation, respectively in the upper and lower subregions of the box, for rather higher speeds of the gas flow in the one direction of throughflow, by rather lower speeds of the gas flow in the other direction of throughflow, converse conditions respectively applying for the upper subregion and lower subregion of the box. As a result, the heat treatment, for example curing, proceeds much more uniformly, and is also speeded up.

For driving, the fans are preferably provided with respective motors, for example electric motors, and are connected thereto by means of shafts, the motors respectively being arranged outside the housing of the box, rotating in tile same sense and being arranged on approximately opposite side wall strips of the housing. In this case, tile essentially vertical side wall strips preferably run obliquely away from an essentially vertical rear wall of the housing of the box, this rear wall being narrower than the essentially vertical charging opening of the box. Preferably, in addition to this, with the corresponding design of the apparatus with two fans, in each case a gas-conducting branch and a shaft may have essentially congruent longitudinal axes which meet essentially at the center point of tile heating spiral, or on the helix axis, of the latter, and preferably form an obtuse angle, so that the fans are arranged so as to be obliquely inclined with respect to each other.

These preferred measures achieve the effect, inter alia, that the fans centrifuge the gas into a closed chamber and, on tile other hand, this gas circulates only through a well-defined and optimally designed guide duct. As a result, a predetermined and aligned gas stream is ensured.

The oblique inclination of the fans brings still further major advantages. Firstly, it is known that any deflection of the gas leads to a pressure drop, so that a desired gas stream is greatly reduced. For this reason, in the box according to the invention there should be as few deflections of the gas as possible. This is achieved by the oblique inclination, since the knee formed there tends to lead rather more to an improved introduction of the gas by virtue of the wall radiation towards the magazine. A further advantage is that the side wall part in which the motor is seated may be obliquely designed. Accordingly, the rear wall of the box is designed to be shorter in comparison with the door or charging opening. As a result, there forms next to the box a free space into which only the motor protrudes, the motor not protruding however beyond the principal plane of the side wall. Consequently, it is possible to place a plurality of boxes one next to the other and also one above the other without them hindering one another. Furthermore, such an arrangement needs only a very small interior space, which in turn has a positive effect on the gas flow.

Preferably, in the box there is provided a magazine carrier which is thermally isolated from the housing and on which at least one magazine can be supported in a position centered approximately in front of the charging opening. In this way, the magazine can be arranged at medium height in the box and, as a result, be subjected more evenly to the gas stream.

In this case, a temperature sensor may be arranged essentially at the center of the magazine carrier and thermally coupled to it, the magazine carrier shielding the temperature sensor from direct heat irradiation by the heating spiral of the heater. Furthermore, in the box there may be provided, in addition to the temperature sensor, at least two gas-temperature sensors which are arranged in relation to each other at essentially the same height, and of which in, each case, at least one is assigned to the gas stream of, respectively, one of the two forced-flow ducts, or guide ducts in order to sense its temperature. In this way, the temperature of the components in the magazine can be ascertained best and can be monitored optimally.

For driving the fan, preferably a shaft of the fan connected to a drive or motor arranged outside the box may pass through a shaft seal arranged on the housing, this shaft seal having a shaft gland which has a greater diameter than that of the shaft, and into which there opens out a radial line for feeding in a gas, preferably an inert gas such as nitrogen. In the particular case of the helical fan already mentioned, with a direction of its shaft and of its gas expulsion essentially parallel to the longitudinal direction of the magazine, the shaft of the helical fan preferably is connected by means of a magnetic coupling to a drive or motor arranged outside the box. These measures achieve the effect that the drive of the fan does not cause any leakage of the housing of the box, through which the gas could be contaminated from outside with air and dust or contaminants could escape with the gas to the outside. In the case of the shaft gland with inert gas, this gas washes around the shaft and then both enters into the interior space of the box and leaves the housing, so that no friction at all takes place on the shaft gland and, consequently, no bearing heat is generated; on the contrary, the shaft is cooled by the inert gas. In addition, the motors are arranged outside the box, so that damage to them by the considerable heat in the box is avoided, and also no mounting of the shaft of the motor can run hot.

On the box there is provided a feed line, by means of which firstly a fresh gas, for example an inert gas such as nitrogen or the like, can be introduced into the interior space of the box, for example in order to prevent oxidation of the parts of the lead frames. Then, on the box there is also provided a discharge line, by means of which the gas mixed with harmful subsfances can be conducted away from the interior space of the box. If, for example, a polymerization of epoxy resins is taking place, this gas should also be correspondingly disposed of.

Other designs for the baffles are also conceivable. In particular, it is possible to design the baffles as controllable shut-off plates or gates, so that here, in addition, more specific influencing of the gas stream can take place. However, the outlay is then also more considerable.

One aspect of the invention also relates to the door or the opening of the box. The main consideration here is for as little air as possible from the outside to be brought into the interior space of tile box when opening and closing the door, since this air is laden with dirt particles which could settle on the lead frames and would lead to disturbances, and, if appropriate, must be washed by an inert gas to avoid oxidation.

For this purpose, the door preferably is connected by means of a parallelogram linkage to a main housing supporting the box. This parallelogram linkage preferably comprise, in each case two levers, which are jointedly connected to the sides of the door and to the main housing and which can be moved by a drive. Between two levers there preferably is arranged an essentially horizontal crossmember, in which there is seated a sleeve with an internal thread, through which a fixed spindle rod passes. The spindle rod preferably is connected by means of a drive belt, to a motor.

Due to the fact that tile door is opened by a parallelogram linkage, it can be drawn away from the charging opening, for example downwards or upwards, without, as for example in the case of a hinged door, air being forced into the interior space of the box by slamming of the door. In addition, the seal between the box and the door is uniformly stressed, which ensures a better sealing and a longer serviceability of the seal.

The present curing installation has numerous advantages, which cannot in any way be completely enumerated individually. Due to the controlling and monitoring of virtually all process parameters, the maintenance of a very favorable temperature profile between the lead frames is possible, both with respect to heating and with respect to cooling. This is attributable in particular to the flow conditions chosen. The apparatus is suitable both for operation at high temperatures (for so-called snap curing) and allows treatment with inert gas. The electronic components are subjected to minimal stressing and only extremely low contamination. All the components are exposed at virtually the same time to the same curing conditions.

Moreover, the installation is not restricted to certain magazines, but, instead, various magazine sizes can be treated. Baffles do not have to be exchanged, nor do other precautions have to be taken. Effects of condensation on the chips or lead frames are ruled out.

Further points which should be emphasized are the compact type of design and the simple door mechanism. Such an installation can be integrated into an existing line in a simple and very favorable way.

BRIEF DESCRIPTION OF THE DRAWINGS

Further advantages, features and details of the invention emerge from the following description of preferred exemplary embodiments and also with reference to the drawings, in which.

DESCRIPTION OF THE PREFERRED EMBODIMENTS

Figure 1:
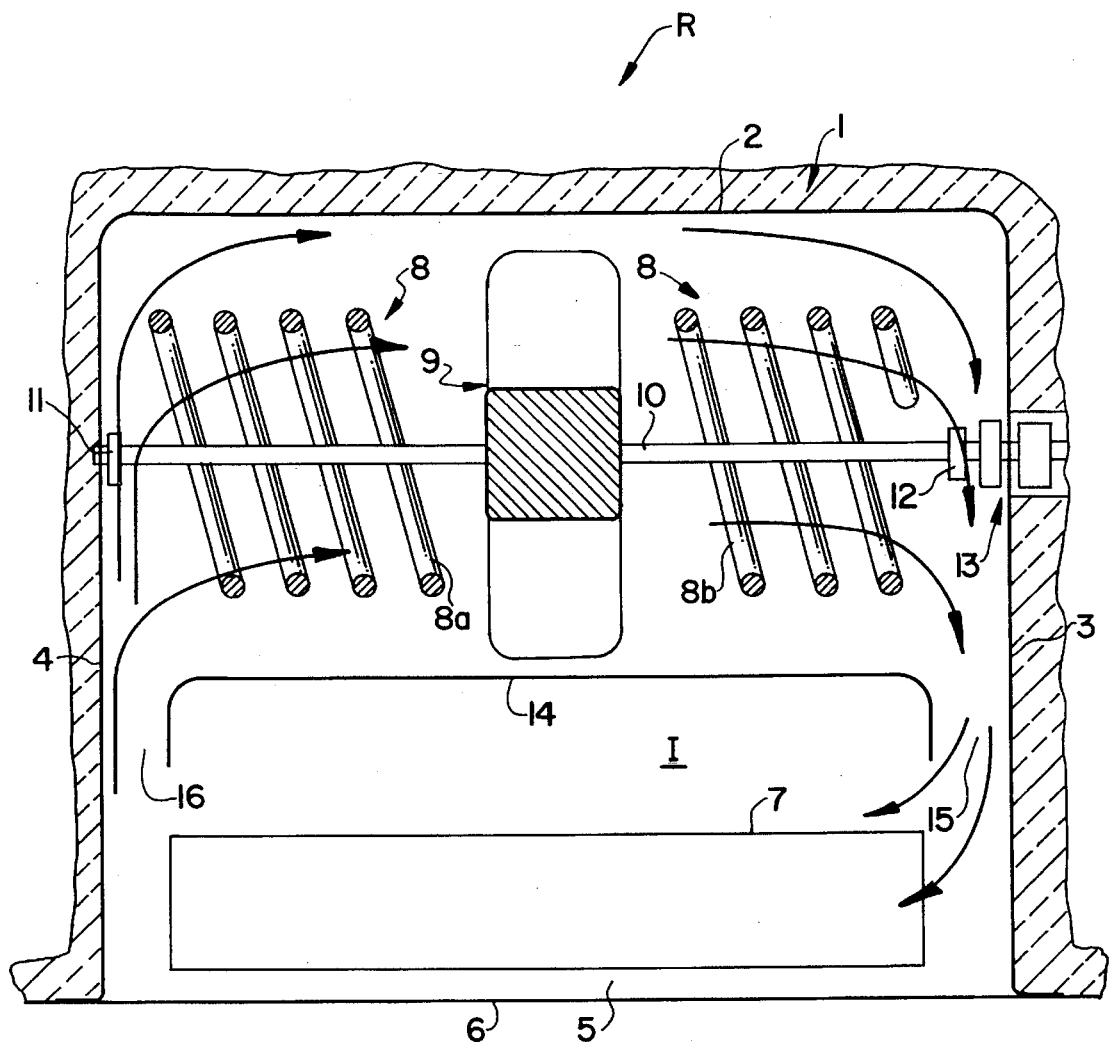
FIG. 1 shows a schematic plan view of an exemplary embodiment of a box according to the invention, in a curing system (not shown in any more detail) for lead frames which are fitted with electronic components.

A box R for a curing installation for lead frames has, according to FIG. 1, a housing 1 closed on all sides, with a preferably vertical rear wall 2, preferably vertical side walls 3 and 4 and also a preferably vertical charging opening 5, which is defined by end edges 29 and is closed by a door 6.

In the box, R there is provided a magazine carrier 7a, on which a magazine 7 is set up centered approximately in front of the charging opening 5 and is consequently arranged approximately at medium height of the box R. Located in the magazine 7 are the lead frames to be treated, so that during one pass in a box R a plurality, for example 40, of such lead frames can be heat-treated in one operation.

The magazine carrier 7a is thermally coupled as well as possible to the magazine 7, but is thermally isolated from the housing 1. For example, the magazine carrier 7a is a cuboidal block of aluminum alloy which is supported on the housing 1 by means of a thermally insulating intermediate layer 7b, for example made of ceramic (cf. in FIG. 4). The magazine 7 is also made of aluminum alloy and its setting-up on the magazine carrier 7a accomplishes the desired thermal contact.

Figure 4:
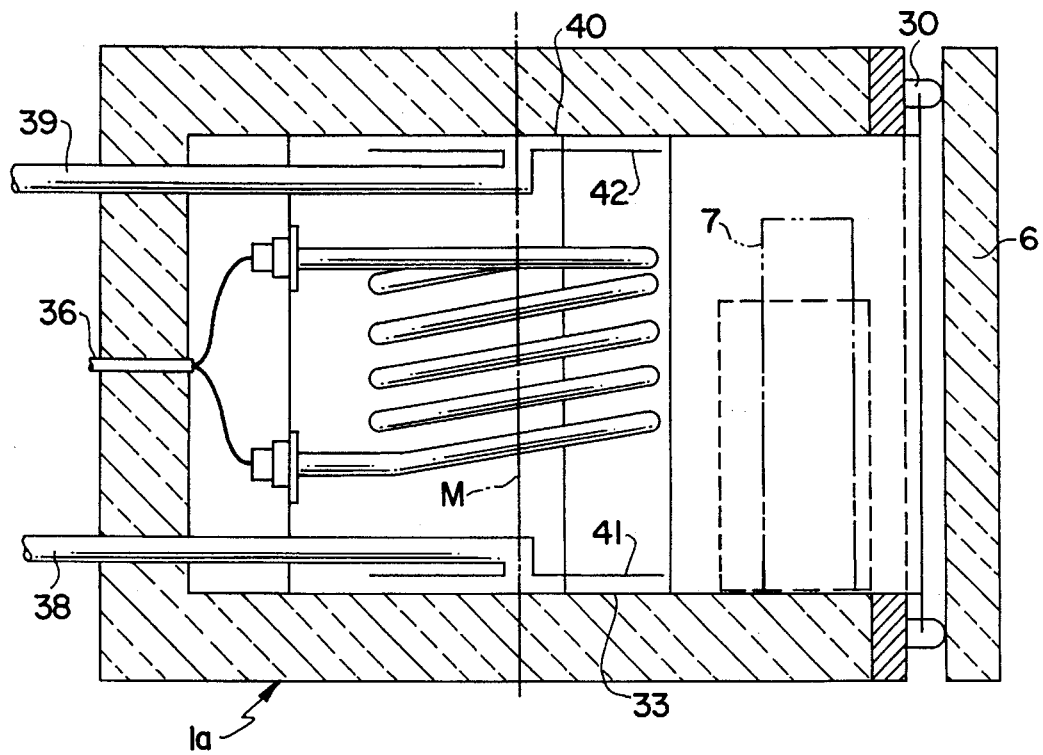
FIG. 4 shows a cross-section through the box according to FIG. 3.

Essentially at the center of the magazine carrier 7a and thermally coupled to it, there is provided a temperature sensor 67c, which can be introduced into the magazine carrier 7a, for example via a duct 67d (cf. in FIG. 4). This temperature sensor 67c is, for example, a thermocouple or else a temperature-sensitive platinum resistor, or the like. By measuring the temperature of the magazine carrier 7a, the temperature sensor 67c makes it possible to control the temperature of the magazine 7 and of the lead frames to be treated.

Located inside the housing 1, is a heater 8, by which a gas in the interior space I can be heated. In the exemplary embodiment shown in FIG. 1, the heater 8 comprises two separately arranged horizontal-axis heating spirals 8a and 8b, which are located in front of and behind a fan 9. The fan 9 is arranged in the housing 1 approximately in the vertical center plane of the latter and its blades are mounted on a horizontal shaft 10, which rotates in (only schematically indicated) bearing blocks 11 and 12. The shaft 10 is connected by means of a magnetic coupling 13 to an external drive (not shown in any more detail).

It can be seen that the temperature sensor 67c is shielded by the magazine carrier 7a from direct heat irradiation by the heating spirals 8a and 8b of the heater 8.

Between fan 9 and magazine 7, there is also provided a baffle 14, which ensures a desired gas flow.

In the exemplary embodiment according to FIG. 1, gas is sucked in from the left by the fan 9 with correspondingly set blades, this gas sweeping through the heating spiral 8a. Furthermore, the fan 9 forces the gas to the right through the other heating spiral 8b, the baffle 14 forming a forced-flow duct 15, through which the gas stream must pass. Thereafter, this heated gas passes through the magazine 7 and the lead frames arranged therein, and is sucked to the left, again through a further forced-flow duct 16, into the region or space of the fan.

It has been found in practice that the gas flowing slowly through the magazine has only a low heat capacity, so that there is a considerable difference in heat at the gas inlet side in comparison with the gas outlet side. This results in an asymmetrical treatment of the lead frames, which is not desired. It is possible to compensate for this disadvantage by reversing the direction of rotation of the fan 9 at certain time intervals, so that the gas inlet side in the magazine 7 changes. This reversal of the direction of rotation may be performed, as already mentioned, for example with a periodicity of 10 to 30 seconds and preferably of 10 seconds. As a result, significantly better results have already been achieved.

Figure 2:
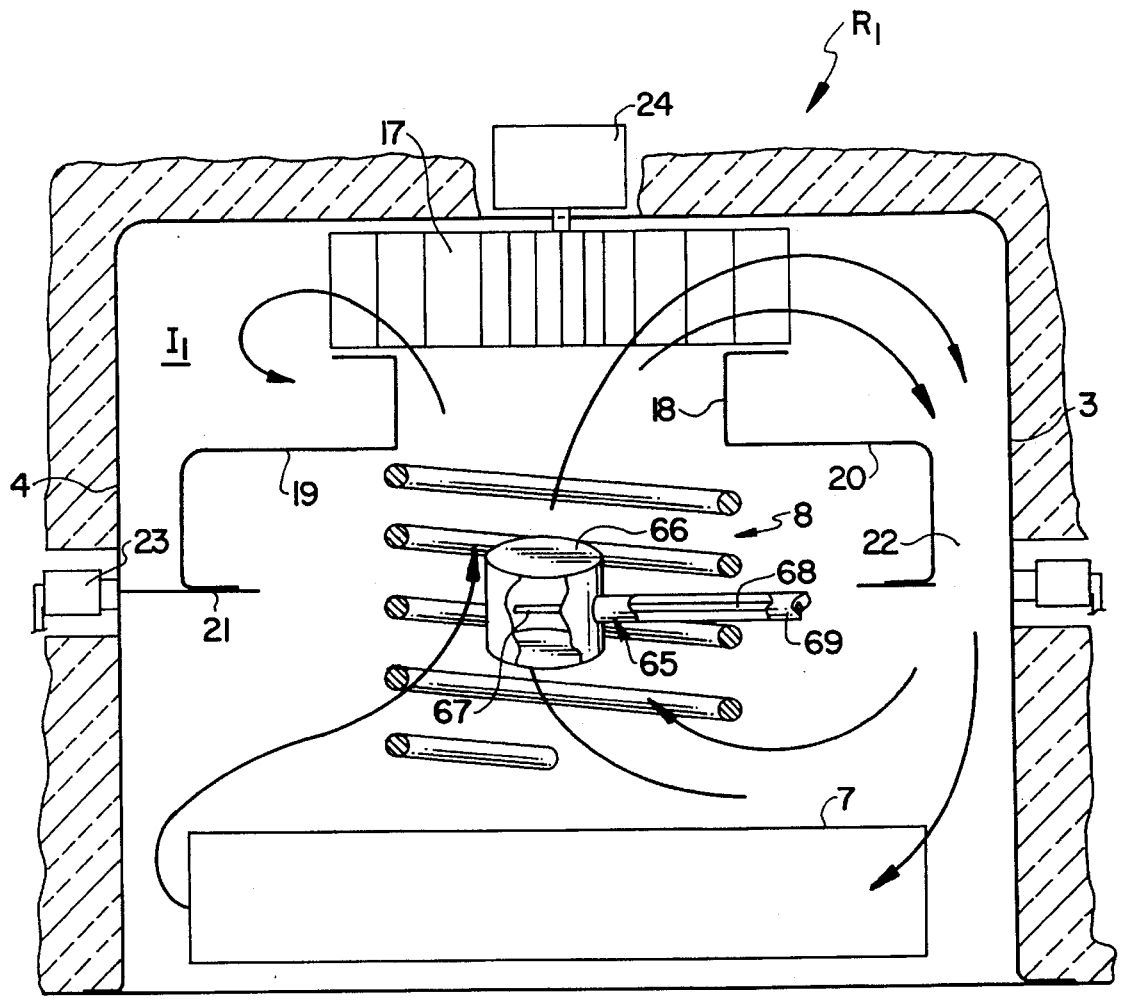
FIG. 2 shows a schematic plan view of a further exemplary embodiment of a box for a curing installation corresponding to FIG. 1.

In a further exemplary embodiment according to FIG. 2, in a box $R_1$ the heater 8 comprises only a single heating spiral, which is arranged between a radial fan 17 and the magazine 7. Between heater 8 and radial fan 17 there is also located a closed gas-conducting branch 18, the sides of which are adjoined by chamber walls 19 and 20. The radial fan 17 is assigned a motor 24.

The chamber walls 19 and 20 form, together with side walls 3 and 4 and with adjustable gates or adjustable shut-off plates 21a and 21b, an interior space $I_1$. The shut-off plate 21a is assigned an actuating device 23a, and the shut-off plate 21b is assigned an actuating device 23b. With the aid of these actuating devices 23a and 23b, the respective shut-off plates 21a and 21b can be displaced between two positions, or gates can be adjusted between two positions, in which they close the interior space $I_1$ or release their respective duct 15a or 15b for a gas flow to the magazine 7. In the position represented in FIG. 2, the duct 15a is closed by the shut-off plate 21a, while the duct 15b is released by the shut-off plate 21b. Consequently, no gas flow passes from the duct 15a to the magazine, while a gas stream is passed via the duct 15b to the magazine 7. This gas stream then flows fully or partially through the magazine 7 and is sucked in again by the radial fan 17 through the gas-conducting branch 18 and the heater 8. By analogy with the preceding text and with equivalent reasons and advantages, the actuation of the shut-off plates or gates may be performed, for example, with a periodicity of 10 to 30 seconds, preferably of 10 seconds, in order to change alternately the gas inlet side at the magazine 7 and the direction of the gas stream through the magazine 7.

In the heater 8, there is, moreover, an additional temperature sensor 65 perspectively indicated. In fact, a tube sleeve 66 runs essentially coaxially with the heater 8. The tube sleeve 66 serves as a thermal shield and mechanical protection for a temperature sensor 67, corresponding connecting lugs 68 being lead out from the interior space $I_1$ of the box $R_1$ through an only partially represented small tube 69. The relative dimensions of the tube sleeve 66 and of the heating spiral of the heater 8 are chosen such that the temperature sensor 67 is shielded by the tube sleeve 66 from direct heat irradiation by the heating spiral of the heater 8. The additional temperature sensor 65 supplies an additional measured temperature value, by which the control of the spatial and temporal temperature profile in the box $R_1$ can be further improved. Such an additional temperature sensor 65 can be used in every exemplary embodiment of the present invention.

Figure 3:
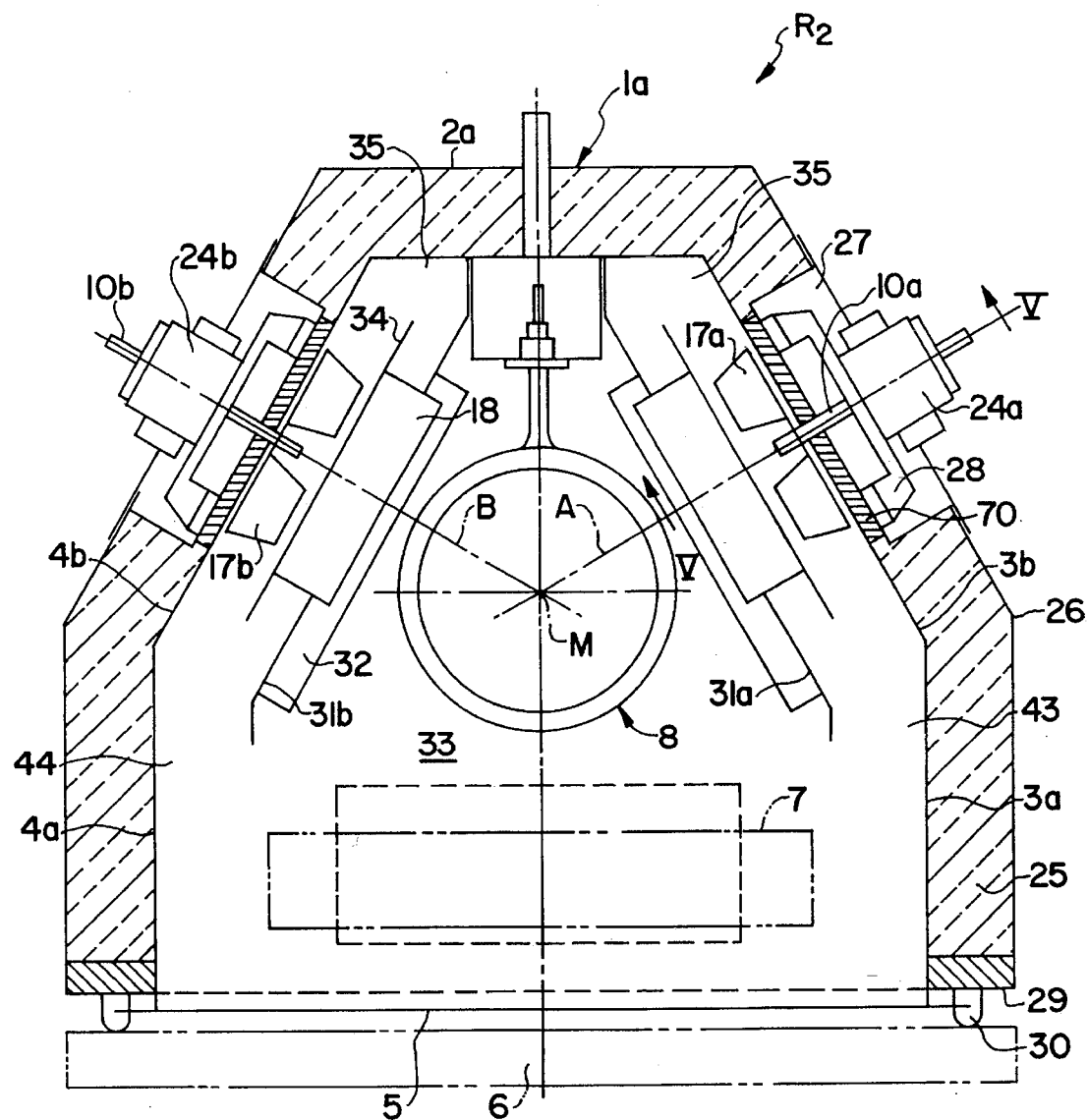
FIG. 3 shows a schematic plan view of a further exemplary embodiment of an opened box for a curing installation according to FIG. 1.
Figure 5:
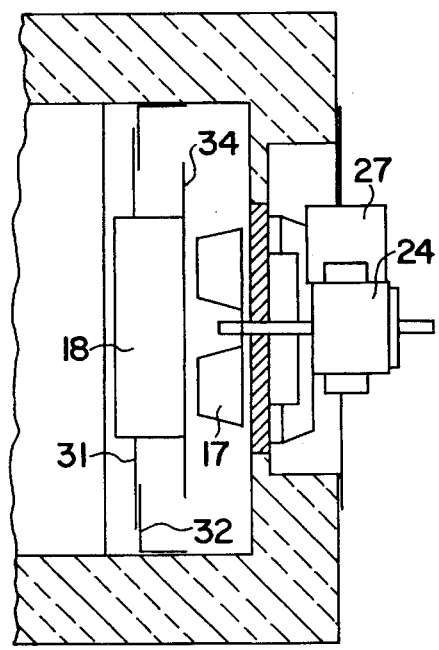
FIG. 5 shows a partially represented cross-section through the box according to FIG. 3 along the line V—V.

A further exemplary embodiment is shown in FIGS. 3 to 5. A housing 1a of a box $R_2$ is, in this case, of a polygonal design and its wall parts are filled with heat-insulating material 25. In the case of this housing 1a, its rear wall 2a is designed to be less wide than its charging opening 5. This charging opening 5 is formed by two approximately parallel-running side wall strips 3a and 4a, which are adjoined by side wall strips 3b and 4b which are bent off towards the rear wall 2a via a knee 26. In these side wall strips 3b and 4b, there are provided recesses 27 for receiving a motor 24a and 24b, respectively, each motor 24a and 24b driving a radial fan 17a and 17b in the interior of the housing 1a. It can be seen, in particular from FIG. 3, that neither of the motors 24a and 24b protrudes out of the outer plane of the housing 1a which is formed by the outer wall of the side strips 3a and 4a. Consequently, a plurality of such boxes $R_2$ can be arranged one next to the other and one above the other without hindering one another due to the arrangement of the motors 24a and 24b outside the boxes $R_2$.

The arrangement of the motors 24a and 24b outside the box $R_2$ has considerable advantages, both for the motor itself, and for the mounting of a shaft 10a, on which the radial fan 17a or 17b is seated. Inside the housing 1a there are, as desired, high temperatures, which would have adverse effects on a motor. It is enough to disturb operation if the shaft 10a is significantly heated. In the present exemplary embodiment, such a hot mounting can be counteracted by corresponding insulating measures such as mounts 28 for the motor 24a or 24b.

Figure 8:
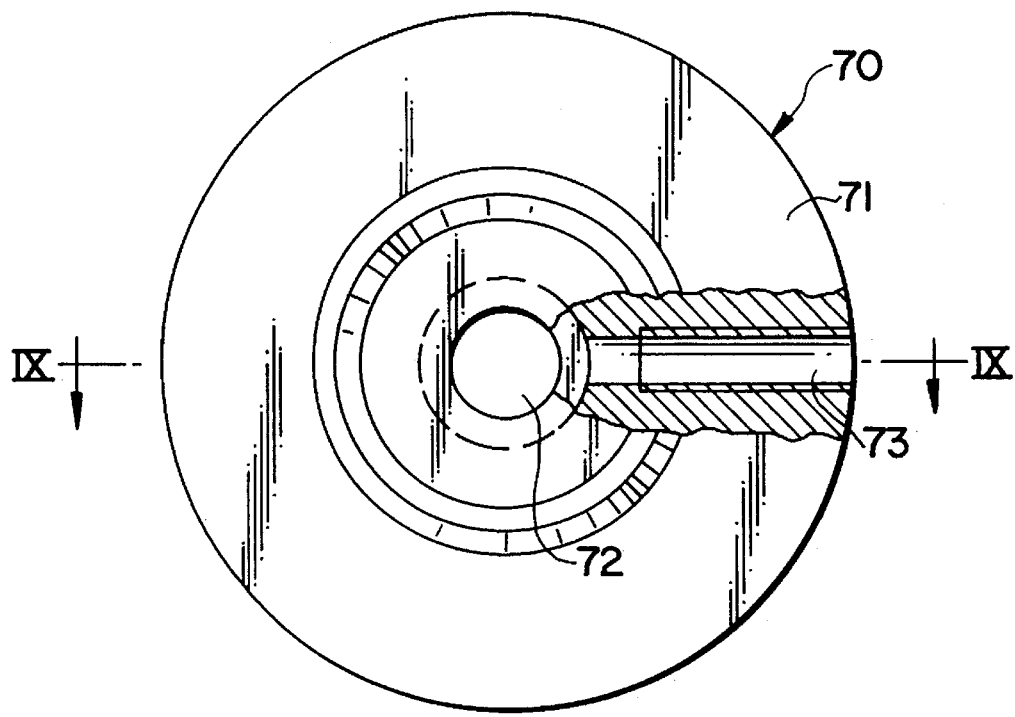
FIG. 8 shows a plan view, represented partially broken, of a shaft seal according to the invention.
Figure 9:
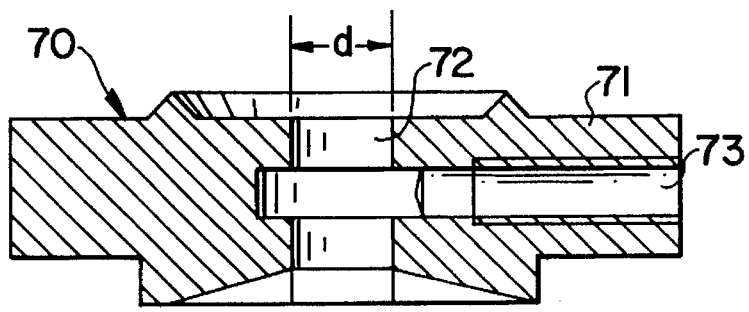
FIG. 9 shows a cross-section through the shaft seal along the line IX—IX of FIG. 8.

A preferred exemplary embodiment of a shaft seal is shown in FIGS. 8 and 9. Such a shaft seal 70 comprises a washer 71, which has approximately in its center a shaft gland 72. The diameter d of the shaft gland 72 is greater than the diameter of the shaft 10a. As a result, the shaft 10a is mounted with play in the shaft seal 70. In the shaft gland 72, there opens out a radial line 73, via which an inert gas, for example nitrogen, is introduced into the shaft gland 72. This gas washes around the shaft 10a and effects a sealing of the interior space of the box $R_2$ to the outside and also to the inside. In addition, this washing-around of the shaft 10a effects its cooling by the gas. Corresponding teed lines for the gas are not shown in any more detail. Consequently, the shaft 10a can pass through the housing of the box $R_2$ without friction and nevertheless no leakage of the housing 1a of the box $R_2$, by which the gas could be contaminated from outside with air and dust, is caused.

In addition, the end edges 29 of the side wall strips 3a and 4a are covered by a corresponding ring seal 30. For the reasons specified below, it is essential that the interior space of the housing 1a remain hermetically sealed. In the polymerization of epoxy resins, subsances are released, so that the gas from the box should not be discharged into the environment, without cleaning or the like. Furthermore, it is important that the treatment of the lead frames be performed as free from dust as possible. In addition, generally an inflow of nitrogen, described later, is mixed in, in order to prevent undesired oxidation.

In the interior of the housing 1a, there run approximately parallel to the obliquely inclined side wall strips 3b and 4b respective walls 31a and 31b, which are supported by means of corresponding plates 32a and 32b against a bottom 33 of the housing. Inserted into each of these walls 31a and 31b, there is a respective gas-conducting branch 18 of the type already mentioned above in the case of another exemplary embodiment, which branch interacts with the corresponding radial fan 17a or 17b. There is advantageously also formed on the gas-conducting branch 18, an annular flange 34, which serves inter alia as a baffle and prevents return flowing of tile sucked-in gas into tile gas-conducting branch 18.

Since the wall 31 runs up to the rear wall 2a, there is formed between radial fan 17 and rear wall 2a a space 35, which is open only towards the radial fan 17. Otherwise, no gas flow in another direction can be produced here.

Between the two walls 31a and 31b, arranged obliquely with respect to each other, the heater 8 is arranged as an upright heating spiral, the helix axis M of which is arranged essentially orthogonally to the respective longitudinal axes A, B of the output branches 18. Longitudinal axis A and longitudinal axis B of the shafts 10a and 10b of the motors 24a and 24b preferably intersect at a center point M of the heater 8, or on the helix axis M of the corresponding heating spiral. The axes A and B also form, moreover, a center axis for the respective gas-conducting branch 18.

It can be seen in FIG. 4 that the heater 8 is connected with an energy source (not shown in any more detail) via corresponding connecting lines 36. Furthermore, there can also be seen in FIG. 4 a feed line 38 and a discharge line 39, which open out in the interior of the housing 1a close to a bottom 33 or a top 40, tile distribution of the fed-in gas and the collection of the gas to be discharged being assisted by a distributor plate 41 and a collecting plate 42, respectively. Fed in, for example, is preheated nitrogen. Discharged, in particular, is a gas which is charged with subsfances released during the polymerization of epoxy resins.

The major advantage of the present invention is firstly that as little gas deflection as possible takes place. A gas deflection always has an undesired pressure drop as a consequence, so that as few deflections as possible are to take place. In the present exemplary embodiment, the slight gas deflection at the knee 26 or in guide ducts 43 and 44 between wall 31a and side wall strip 3a and between walls 31b and side wall strip 4a, respectively, scarcely has a marked effect on the pressure of the flow. The gas then only has to be deflected respectively from both sides to the inlet into the magazine 7. If appropriate, this may be further improved by lateral chicanes (not shown in any more detail) in front of the magazine 7.

The idea of the invention also covers the notion that the motors 24a and 24b can turn, instead of in the same sense, also in the opposite sense, whereby however, a gas flow on both sides of the magazine 7 is intensified either in the tipper region or in the lower region, while the gas flow is reduced in the other region respectively. This results from the following consideration:

If, for example, the radial fan 17a is rotating clockwise, gas is centrifuged by the lower half of the impeller of the radial fan 17a rearwards into the chamber 35, or against the rear wall 2a. A delivery of gas through the guide duct 43 takes place, on the other hand, through the upper part of the impeller of the radial fan 17a. Consequently, the gas flow is accelerated in the upper housing region, so that a flow at the lead flames stored at the top in the magazine 7 is also intensified. The same explanation also applies to the radial fan 17b, provided that its motor 24b is turning counter-clockwise. Consequently, two intensified gas streams meet each other in the upper region of the magazine 7, while the lower region of the magazine is essentially neglected.

For this reason, both motors 24a and 24b are preferably caused to turn in the same sense. As a result, it is ensured that, in an upper region of the box $R_2$, higher speeds of the gas flows in the one direction of throughflow (fan 17a with motor 24a) are compensated by somewhat lower speeds of the gas flows in the other direction of throughflow (fan 27b with motor 24b), while the converse of this applies in a lower region of the box $R_2$ and consequently, in the box $R_2$ there is produced a system of gas flows which, viewed through the vertical charging opening 5, appears to have a symmetry about the center and the diagonals (but not the center lines) of the recfangular charging opening 5.

Here, too, a periodic reversal of the direction of rotation of the motors leads to a changing distribution of the gas stream in the box $R_2$, and, consequently, to an improvement in the handling of the lead frames. By analogy with the preceding text and with equivalent reasons and advantages, this joint reversal of the direction of rotation of the two fans may be performed, for example, with a periodicity of 10 to 30 seconds, preferably of 10 seconds, in order to change alternately the direction and distribution of the gas stream through the magazine 7. As in the case of the designs described above, here, too, in the box $R_2$ there is provided a magazine carrier 7a, on which a magazine 7 is set up centered approximately in front of the charging opening 5, and, consequently, is arranged at medium height of the box $R_2$, in order for it to be subjected more uniformly to the gas stream. Here too, the magazine carrier 7a is thermally coupled as well as possible to the magazine 7, but is thermally isolated from the housing 1 or from its bottom 33 by means of the intermediate layer 7b (cf. in FIG. 4), and here, too, essentially at the center of the magazine carrier 7a and thermally coupled to it, there is provided a temperature sensor 67c, which can be introduced into the magazine carrier 7a via a duct 67d (cf. in FIG. 4), in order too make it possible, by measuring the temperature of the magazine carrier 7a, to control the temperature of the magazine 7 and of the lead frames to be treated. In this case, the temperature sensor 67c is shielded by the magazine carrier 7a from direct heat irradiation by the heating spiral of the heater 8.

In addition to the temperature sensor 67c, in the box $R_2$ there are provided two gas-temperature sensors 67a and 67b (cf. in FIG. 3), which are both arranged at medium height of the box $R_2$, and, consequently, in relation to each other essentially at the same height approximately at the end of the walls 31a and 31b, in order to sense the temperature of the respective gas streams in the guide ducts 43 and 44. There may also be provided more than one such pair of gas-temperature sensors (cf. in FIG. 4), for example six temperature sensors (of which only the three left-side gas-temperature sensors 67b', 67b" and 67b'" are visible in FIG. 4). Such gas-temperature sensors are then arranged in pairs in relation to each other essentially at the same height in the box $R_2$, for example also at the end of the walls 31a and 31b. These additional gas-temperature sensors 67a and 67b allow, by means of their temperature, the symmetry of the gas streams in the box $R_2$ to be ascertained and subsequently the symmetry of the operation of the box $R_2$ to be monitored. In this way, the maintenance of the temperature profile at the components in the magazine can be ascertained best and can be monitored optimally.

Such gas-temperature sensors can also be used in conjunction with other designs of the invention, for example in order to ascertain, by means of their temperature, the symmetry of the gas streams in the forced-flow ducts 15 and 16 of the box R of the design according to FIG. 1 or in the forced-flow ducts 15a and 15b of the box R of the design according to FIG. 2.

Figure 6:
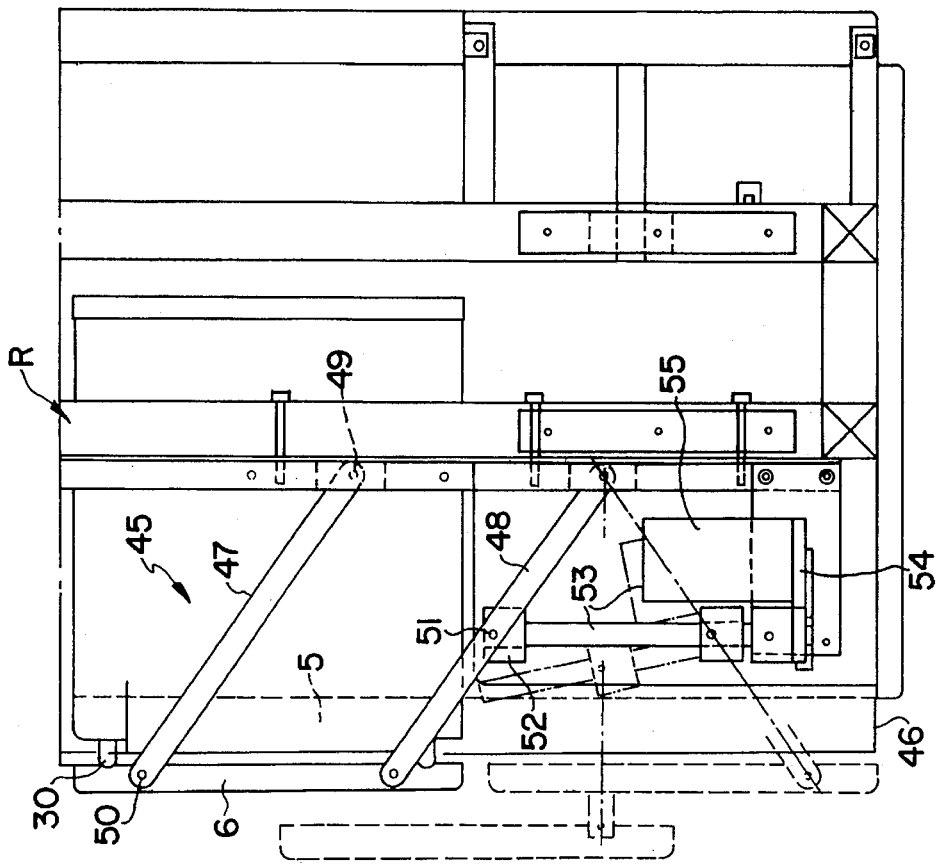
FIG. 6 shows a side view of part of a curing installation having a integrated box.

It is beneficial for automatic charging of the box R if the door 6 can be opened fully automatically and removed entirely from the region of the charging opening 5. According to FIGS. 6 and 7, there is provided for this purpose a parallelogram linkage 45, by means of which the door 6 can be brought away from the charging opening 5 into an end position underneath the charging opening 5 close to a main housing 46 of the curing installation. This end position and an intermediate station are indicated by dashed lines in FIG. 6.

The parallelogram linkage 45 has two parallel-arranged levers 47 and 48, which on the one hand form a fixed pivot joint 49 with the box R above the main housing 46, while on the other hand they are connected by means of a further pivot joint 50 to the door 6.

The levers 48 are connected by means of pivot pins 51 to a crossmember 56, in which there is mounted a sleeve 52 which has an internal thread (not shown in any more detail). This internal thread meshes with a spindle rod 53, which is rotatably mounted and is connected with a motor 55, for example by means of a drive belt 54. The entire drive arrangement is tiltably mounted, so that allowance can be made for the movement of the parallelogram linkage 45, as is also represented by dashed lines.

Figure 7:
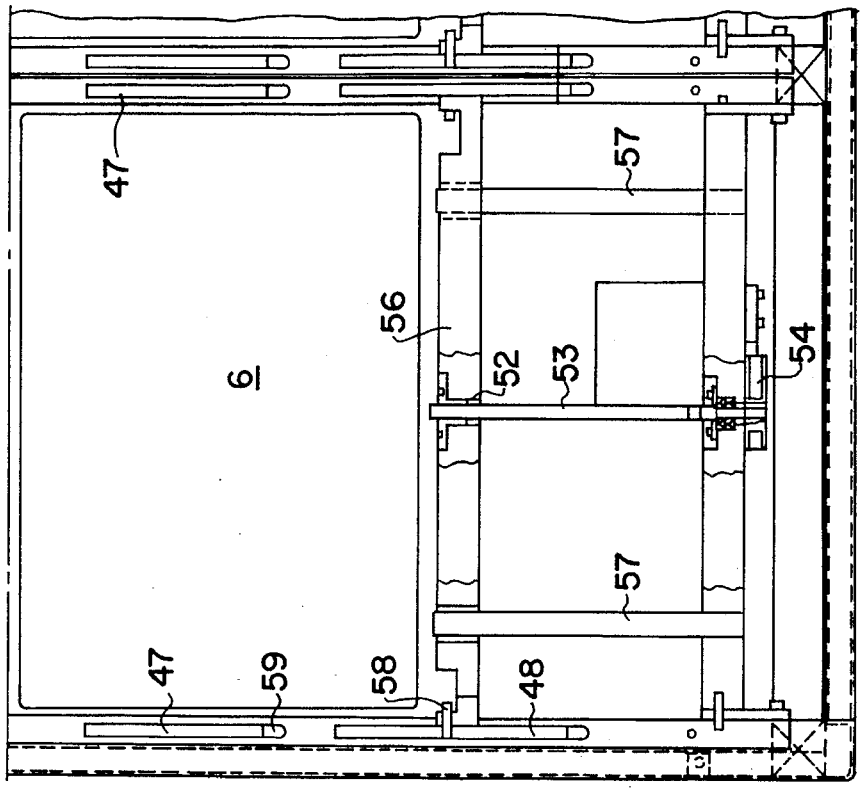
FIG. 7 shows a plan view of the part of the curing installation according to FIG. 6.

In FIG. 7 it can be seen that the crossmember 56 can slide along guide columns 57. Laterally, the crossmember 56 is connected by means of corresponding pins 58 to the lower lever 48, both lever 48 and lever 47 moving in slots 59 in the main housing 46. In FIG. 7, it is indicated on the right that right next to one box there may be placed a further box.

With the aid of this parallelogram linkage, the door 6 can be moved in relation to the charging opening 5, the door 6 always remaining parallel to the plane of the charging opening 5, and consequently to the seal 30. During closing of the box, therefore, the seal 30 is compressed and stressed simultaneously and uniformly over its entirety between the box and the door, which reduces the wear of the seal, and consequently improves the sealing, and also ensures longer serviceability of the seal.

What is claimed is:

1. A curing oven for heat treating lead frames fitted with electronic chips, while the lead frames are disposed in a cuboidal magazine having a horizontally extending longitudinal axis and the lead frames extend parallel to one another and to said longitudinal axis, said curing oven comprising:

a box having a housing providing a heat-treating cavity for receiving said magazine, said housing being provided with a charging opening for said cavity, said opening being defined by perimetrical edges, and an openable door closing said opening;

a heater for providing a heated gas within said heat-treating cavity;

fan means comprising at least two fans arranged to be alternately used, for organizing said heated gas into a gas stream flowing along a path within said heat-treating cavity; and at least one gas stream-directing element fixedly arranged within said heat-treating cavity for directing said gas stream to flow subsfantially horizontally and parallel to said longitudinal axis in a section of said path which, in use, is proximate said magazine;

said fan means being operable for reversing direction of flow of said gas stream along said path, including in said section of said path, for thereby evening direction of flow-dependent disparity in heating effects of the heated gas on the lead frames fitted with electronic chips.

2. The curing oven of claim 1, wherein:

said gas stream-directing element is a baffle.

3. The curing oven of claim 1, wherein:

each said fan is a helical fan.

4. The curing oven of claim 1, wherein:

said heater is disposed adjacent said fans effectively in both directions along said path.

5. The curing oven of claim 1, wherein:

said gas stream-directing element comprises ducts through which, in use, said gas stream flows.

6. The curing oven of claim 1, wherein:

each fan includes at least one impeller located inside said cavity, a motor located outside said cavity, and a drive shaft means effectively extending through said box for operatively connecting said motor with said impeller.

7. The curing oven of claim 6, wherein:

said drive shaft means includes a first drive shaft portion within said cavity, a second drive shaft portion outside said cavity and a magnetic coupling effectively connecting said first and second drive shaft portions.

8. The curing oven of claim 6, wherein:

said drive shaft means includes a drive shaft penetrating through a wall of said box, and a shaft seal provided for said shaft in said wall of said box.

9. The curing oven of claim 8, further including:

an inert gas inlet pipe penetrating in through said box into said cavity, and an exhaust gas outlet pipe penetrating out through said box from said cavity.

10. The curing oven of claim 9 wherein:

said gas inlet pipe penetrates into said box through a respective said drive shaft.

11. The curing oven of claim 1, wherein:

said charging opening is defined in a bottom wall of said housing, and said housing has a top which includes a central generally horizontal portion disposed between two oppositely pitched portions, said heater is suspended vertically from said central portion, and said fans are suspended from respective of said pitched portions.

12. The curing oven of claim 1, further including:

a magazine carrier disposed in said cavity and arranged to support said magazine at said section of said path, in thermal isolation from said housing and centered on said charging opening.

13. The curing oven of claim 12, further including:

a temperature sensor arranged on and thermally coupled to said magazine carrier and shielded by said magazine carrier from direct heat irradiation by said heater.

14. The curing oven of claim 1, wherein:

said at least one fixed gas stream directing element includes respective ductwork associated with each said fan.

15. The curing oven of claim 14, further including:

a respective gas temperature sensor for said ductwork of each said fan.

16. The curing oven of claim 1, further including:

a parallelogram linkage supporting said door from said box for closing and opening of said door.

17. The curing oven of claim 16, further including:

a drive operatively associated with said parallelogram linkage for opening and closing said door.

* * * * *